United States Patent
Lu et al.

(10) Patent No.: US 9,577,149 B2
(45) Date of Patent: Feb. 21, 2017

(54) CONTINUOUS SYNTHESIS OF HIGH QUANTUM YIELD INP/ZNS NANOCRYSTALS

(71) Applicant: Quantum Materials Corporation, San Marcos, TX (US)

(72) Inventors: Huachang Lu, Cologne (DE); Werner Hoheisel, Cologne (DE); Leslaw Mleczko, Dormagen (DE); Stephan Nowak, Cologne (DE)

(73) Assignee: Quantum Materials Corporation, San Marcos, TX (US)

( * ) Notice: Subject to any disclaimer, the term of this patent is extended or adjusted under 35 U.S.C. 154(b) by 0 days.

(21) Appl. No.: 14/361,862

(22) PCT Filed: Nov. 26, 2012

(86) PCT No.: PCT/EP2012/073552
§ 371 (c)(1),
(2) Date: May 30, 2014

(87) PCT Pub. No.: WO2013/079423
PCT Pub. Date: Jun. 6, 2013

(65) Prior Publication Data
US 2014/0326921 A1    Nov. 6, 2014

(30) Foreign Application Priority Data
Dec. 1, 2011  (EP) .................................... 11191589

(51) Int. Cl.
*C30B 7/08* (2006.01)
*H01L 33/30* (2010.01)
(Continued)

(52) U.S. Cl.
CPC ................ *H01L 33/30* (2013.01); *B01J 13/02* (2013.01); *B82Y 30/00* (2013.01); *C30B 7/00* (2013.01);
(Continued)

(58) Field of Classification Search
CPC ........... C01G 9/06; C01G 15/006; C30B 7/00; C30B 7/08; C30B 29/40; C30B 29/48; C30B 29/70; B82Y 30/00; B82Y 40/00; B82Y 20/00; Y10S 977/95; Y10S 977/774; Y10S 977/892; B01J 13/02
See application file for complete search history.

(56) References Cited

U.S. PATENT DOCUMENTS

| | | |
|---|---|---|
| 7,833,506 B2 | 11/2010 | Rauscher et al. |
| 2002/0083888 A1 | 7/2002 | Zehnder et al. |
| 2010/0068522 A1 | 3/2010 | Pickett et al. |

FOREIGN PATENT DOCUMENTS

| | | |
|---|---|---|
| CN | 102031110 A | 4/2011 |
| WO | 02053810 A1 | 7/2002 |

OTHER PUBLICATIONS

English machine translation of CN102031110A.*
(Continued)

*Primary Examiner* — Richard M Rump
(74) *Attorney, Agent, or Firm* — Baker & Hostetler LLP

(57) ABSTRACT

The invention relates to a continuous-flow synthesis process for the preparation of high quality indium phosphide/zinc sulfide core/shell semiconduting nanocrystals in particular quantum dots (QD) conducted in a micro-reaction system comprising at least one mixing chamber connected to one reaction chamber.

6 Claims, 5 Drawing Sheets

Figure 1:
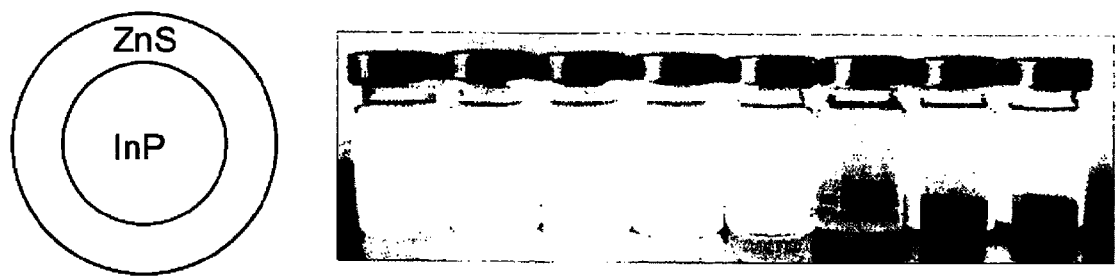

(51) Int. Cl.
  B82Y 30/00      (2011.01)
  C30B 29/40      (2006.01)
  C30B 29/48      (2006.01)
  C30B 29/60      (2006.01)
  B01J 13/02      (2006.01)
  C30B 7/00       (2006.01)
  B82Y 40/00      (2011.01)
  B82Y 20/00      (2011.01)

(52) U.S. Cl.
  CPC ............ *C30B 7/08* (2013.01); *C30B 29/40* (2013.01); *C30B 29/48* (2013.01); *C30B 29/60* (2013.01); *B82Y 20/00* (2013.01); *B82Y 40/00* (2013.01); *Y10S 977/774* (2013.01); *Y10S 977/892* (2013.01); *Y10S 977/95* (2013.01)

(56) References Cited

OTHER PUBLICATIONS

Wan, Zhen, Weiling Luan, and Shan-tung Tu. "Size controlled synthesis of blue emitting core/shell nanocrystals via microreaction." The Journal of Physical Chemistry C 115.5 (2010): 1569-1575.*

International Search Report received in PCT/EP2012/073552 mailed Dec. 21, 2012.

Ho-June, et al., Facile Consecutive Solvothermal Growth of Highly Fluorescent INP/ZnS Core/Shell Quantum Dots Using a Safer Phosphorus Source; Facile Consecutive Solvothermal Growth of Highly Fluorescent InP/Zns Core/Shell Quantum Dots Using a Safer Phosphorus Source, Nanotechnology, IOP, Bristol, GB, vol. 22, No. 23, Apr. 12, 2011.

Xie et al., Colloidal InP Nanocrystals as Efficient Emitters Covering Blue to Near-Infrared, Journal of the American Chemcial Society, American Chemical Society, Washington, D.C., vol. 129, Jan. 1, 2007, pp. 15432-15433, XP008098788.

European Search Report received in EP 11 19 1589 dated May 16, 2012.

Xu, et al., Rapid Synthesis of Highly Luminescent InP and InP/Zns Nanocrystals, Journal of Materials Chemistry, J. Mater. Chem., 2008, 18, 2653-2656 | 2653.

Valera, et al. The Flows the Thing . . .Or Is It? Assessing the Merits of Homogeneous Reactions in Flask and Flow, Essays, Process Optimization, DOI: 10.1002/anie.200906095, Angew. Chem. Int. Ed. 2010, 49, 2478-2485, pp. 2478-2485.

Jobin Won Ltd., A Guide to Recording Fluorescence Quantum Yields, http://www.horiba.com/fileadmin/uploads/Scientific/Documents/Fluorescence/quantumyieldstrad.pdf, retrieved Oct. 5, 2011.

Li, et al., One-pot Synthesis of Highly Luminescent InP/ZnS Nanocrystals without Precursor Injection CEA Grenoble, INAC/SPrAM (UMR 5819 CEA-CNRS-UJF), May 25, 2008, Grenoble, France.

Battaglia et al., Formation of High Quality InP and InAs Nanocrystals in a Noncoordinating Solvent, NANO Letters 2002 vol. 2, No. 9 1027-1030, Department of Chemistry & Biochemistry, UniVersity of Arkansas, Received Jul. 9, 2002, 4 pages.

Barwick, Trends in Analytical Chemistry, vol. 16, No. 6, 1997, p. 293 ff. Table 5 Strategies for solvent selection—a literature review; Elsevier Science B. V., Teddington, UK, pp. 293-309.

Xu, et al., Rapid Synthesis of High-Quality InP Nanocrystals, J. Am. Chem. Soc. 2006, 128, 1054-1055.

* cited by examiner

CONTINUOUS SYNTHESIS OF HIGH QUANTUM YIELD INP/ZNS NANOCRYSTALS

CROSS REFERENCE TO RELATED APPLICATIONS

This application is a §371 National Stage Application of PCT/EP2012/073552, filed Nov. 26, 2012 which claims priority to EP 11191589.8, filed Dec. 1, 2011.

BACKGROUND

Field of the Invention

The invention relates to a continuous synthesis process for the preparation of high quality indium phosphide/zinc sulfide core/shell semiconduting nanocrystals in particular quantum dots (QD).

Description of Related Art

Colloidal semiconductor nanocrystals have attracted intense interest during the past two decades, owing to their unique chemical, physical, electronic properties, which brings many potential technological applications in biological labeling, LEDs, lasers, photovoltaics and sensors, etc. Among all II-VI and III-V semiconductors, InP is probably the only system which offers a compatible, or even broader emission color range than the CdSe-based system but eliminating intrinsic toxicity since InP contains neither Class A elements (Cd, Hg, Pb), nor class B elements (e.g. As, Se) (Xie et al. *J. AM. CHEM. SOC.*, 2007, 129, 15432; Reiss et al. *J. AM. CHEM. SOC.*, 2008, 130, 11588). Nevertheless, synthesis of high-quality InP remains challenging. The existing problems include among others low photoluminescence quantum yield, poor size distribution, sensitive precursors and poor control of the stability. The synthesis procedure of InP is also more delicate compared to the one of CdSe-based QDs partially due the highly sensitive phosphine precursors (Nann et al. *J. AM. CHEM. SOC.*, 2006, 128, 1054; Nann et al. *J. Mater. Chem.*, 2008, 18, 2653).

Making use of the micro-reaction technique based continuous synthesis facility; we are exploring solutions for these problems. In recent years, micro-reaction technology has emerged as an alternative for the synthesis of high-quality nanoparticles due to the advantages that this technology provides: Precise control of the reaction parameters like temperature profiles, miniaturized reaction volume, fast reaction speed and its parallel operation possibility may lead to a scalable process of production of various nanoparticles (Blackmond et al. *Angew. Chem. Int. Ed.* 2010, 49, 2478; WO2008061632, WO2002053810). Besides, the enhanced heat transfer and mixing efficiencies in the micro-channel allow elevating the precursor reactant concentration above the nucleation threshold in a very short period of time, and the burst of nucleation can be promoted by raised temperature providing a reliable strategy to separate the nucleation and growth phases during the heating stage required to achieve a better particle size distribution.

Although WO2008061632 and WO2002053810 mention the continuous preparation of binary semi-conducting nanoparticles using micro-reaction technique should be applicable for the preparation of InP nanoparticles, the methods were only exemplified with Cd-based cores and needed to be modified to solve the particular problems of the preparation of nanoparticles comprising InP core.

There was a need for a method for the preparation of InP nanocrystals leading to high photoluminescence quantum yield, narrow size distribution and enhanced stability despite the use of sensitive precursors.

The stabilization of InP nanoparticle using a protective ZnS shell is known to enhance environmental stability, chemical and photochemical stability, reduced self-quenching characteristics, and the like. In particular Peng et al. [*J. Am. Chem. Soc.*, 2007, 12, 15432-15433] describe the "one-pot" preparation of InP/ZnS core shell nanoparticles wherein the size range reachable for one reaction was readily tuned by the concentration of amines, the concentration and chain length of fatty acids in particular myristic acid used for dissolving $In(Ac)_3$ precursor, and the reaction temperatures (below 200° C.). The most convenient method in tuning the size was by varying the concentration of the fatty acid.

The fluorescence properties of semiconduting nanocrystals are known to depend on the quantity and quality of surface defects. Surface capping ligands are known to be crucial to achieve high quantum yield nanocrystals. A metal rich surface is also advantageous for a good saturation of surface defects. The typical capping ligands for II-VI semiconductor nanocrystals, such as trioctyl phosphine oxide (TOPO) and trioctyl phosphine (TOP) have stronger coordinating strength towards indium than for example, cadmium. It was found that InP nanoclusters dissolve rapidly in the presence of these ligands at temperature above 200° C., which leads to unstable initial nuclei, more intrinsic defects and slower crystallization process. Nann et al. teach that only weak or non-coordinating ligands added to the core reaction mixture are able to prevent the negative influence of strong coordinating ligands and an excess of indium precursor is necessary to avoid nanocrystal aggregation due to the lack of surface ligands. The excess of indium precursor was shown not only to support rapid nucleation, but also to provide an indium rich surface with reduced surface defects [Nann et al. *J. Mater. Chem.*, 2008, 18, 2653]. Nann et al. also teach that addition of stable zinc carboxylate into the reaction mixture does not result in lattice doping due to intrinsic low reactivity of zinc carboxylate compared with the other reagents involved in the synthesis but that zinc helps passivating the InP surface by coupling to the dangling phosphine bonds, hence enhancing the photoluminescence quantum yield of InP nanocrystals significantly. Furthermore, the addition of zinc carboxylates was shown to stabilize the QDs' surfaces and reduce the critical nuclei size as shown by shift of the photoluminescence emission wavelength to the blue observed with increasing concentration of initial zinc carboxylate [Nann et al. *J. Mater. Chem.*, 2008, 18, 2653]. Typically tris(trimethylsilyl) phosphine (TTSP) is used as P-precursor for the preparation of InP core [Nann et al. *J. Mater. Chem.*, 2008, 18, 2653]. However TTSP is sensitive to oxidation and requires intensive degasing under inert atmosphere before use and throughout reaction process, so handling during batch production is delicate, time consuming and costs are high.

There was a need for a method for the preparation of InP/ZnS core/shell nanocrystals leading to high photoluminescence quantum yield, narrow size distribution and enhanced stability despite the use of sensitive precursors, wherein production costs are reduced.

SUMMARY

The problem was solved by a continuous-flow method for the preparation of InP/ZnS nanoparticles conducted in a micro-reaction system comprising at least one mixing chamber connected to one reaction chamber and comprising the following steps:

1. Preparing an indium precursor solution by mixing an indium salt, a fatty protic alkyl amine and a fatty alkyl acid as weak or non-coordinating ligands and zinc carboxylate with an inert solvent optionally heating up to 50-200° C., preferred 80-150° C. to get a clear solution under water and oxygen free atmosphere,
2. Preparing a phosphine precursor solution comprising tris(trimethylsilyl) phosphine (TTSP) in the inert solvent under water and oxygen free atmosphere,
3. Injecting the indium precursor solution in excess to the phosphine precursor solution into the mixing chamber to obtain a reaction mixture, wherein the mixing chamber is a magnetic mixing micro-chamber, preferably at a flow rate from 0.1 ml/min to 10 ml/min,
4. Forwarding and heating the reaction mixture at a temperature from 160 to 320° C., preferred 200 to 280° C. within the reaction chamber until InP core suspension is obtained,
5. Forwarding the core suspension into a mixing chamber and injecting a shell precursor solution comprising a Zn and a S source to the core suspension and preferably capping ligands into the mixing chamber,
6. Forwarding and heating the suspension at a temperature from 160 to 320° C., preferred 200 to 280° C. for shell preparation within the reaction chamber,
7. Cooling.

DETAILED DESCRIPTION OF A PREFERRED EMBODIMENT

Figure 3:
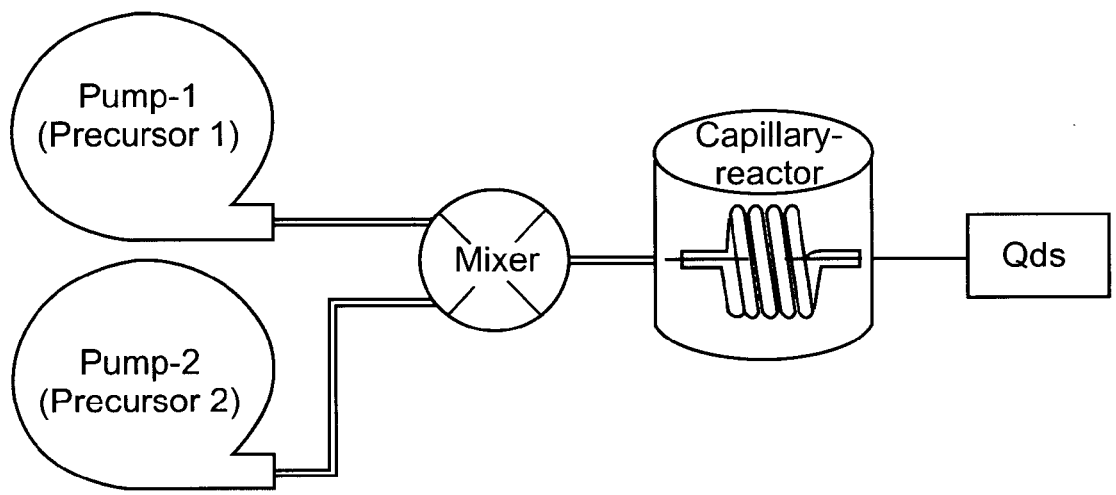

In a preferred embodiment the process of the present invention is conducted in a microreaction system as shown in FIG. 3.

Highly efficient mixing of the precursors was found to be advantageous and was achieved by a turbulent flow, created by the active magnetic agitation within a miniature polytetrafluoroethylene (PTFE) mixing chamber of 10-1000 $mm^3$, preferred from 30-70 $mm^3$ volume later called mixer.

Typically the nucleation and growth of QDs is triggered in a polytetrafluoroethylene (PTFE) capillary as a reaction chamber connected to the mixing chamber having an inner diameter from 0.1-2.0 mm, preferred from 0.2-1.0 mm and of 0.5 to 20 meter length set at a temperature from 20-320° C., preferred from 120-280° C. t. The flow rate is preferably adjusted from 0.1 ml/min to 10 ml/min.

Used micro-reaction system in particular magnetic mixing micro-chamber was found to be particularly adapted to the preparation of InP/Zns nanocrystals because it provides highly efficient mixing and is easy to produce and upscale.

The heating oil provided a facile heating source to achieve the desired temperature for different reaction stages. Alternatively a micro-heater may be used.

Oxygen-free atmosphere is typically nitrogen or argon.

Preferred solvent is non or weakly coordinating liquid at room temperature preferably non polar or low polar. The polarity index can vary from 4 to 0, preferably 1.5 to 0, most preferably 0.8 to 0, based on the polarity index of water being 9, according to the polarity scale (V. J. Barwick, Trends in Analytical Chemistry, vol. 16, no. 6, 1997, p. 293ff, Table 5). The organic solvents, during the reaction temperature, should be stable and degrade as little as possible.

Preferably the boiling point of organic compound is above 200° C., more preferably above 240° C. Among others suitable solvents are octadecene (ODE) or myristic acid methyl ester, dibutyl sebacate, 1-hexadecene, 1-eicosene, paraffin wax, diphenyl ether, benzyl ether, dioctyl ether, squalane, trioctylamine, heat transfer fluids or any solvent mixture thereof. Most preferred is ODE.

Indium salts are typically indium(III) chloride, indium (III) acetate, indium(III) bromide, indium(III) nitrate, Indium(III) sulfate, Indium(III) perchlorate or Indium(III) fluoride. Most preferred are indium(III) chloride and indium(III) acetate.

A mixture of fatty protic alkyl amine and fatty alkyl acid is used as weak or non-coordinating ligands to form stable Indium-ligand complexes in the indium precursor solution. Suitable fatty carboxylic acids are e.g. stearic acid, oleic acid, myristic acid. Fatty alkyl amines are typically hexadecylamine, dioctylamine or oleylamine.

Suitable zinc carboxylates for the passivation of the InP surface are zinc undecylenate and zinc stearate.

Most preferred is a mixture of oleic acid and oleylamine and zinc stearate.

The amount of ligands (fatty amine and fatty acid) is carefully selected with an amine/acid ratio around 4.0-1.0 to avoid either the oxidation or reduction of indium and form stable indium complexes for a controllable nucleation and crystal growth process as the effect of the concentration of the ligands is known to be dramatic for accurate control of the reaction and preparation of nanocrystals with distinguishable absorption peaks [Peng, X. G. et al. Nano Lett. 2002, 2, 1027-1030].

By varying the concentration of carboxylic acid, zinc carboxylate and/or alkyl amine, the particle size of InP was tuned and the corresponding emission color could varied from blue to red. In a preferred embodiment the size of InP QDs is controlled by varying the zinc carboxylate concentration.

The Indium precursor solution is typically added to the mixture of tris(trimethylsilyl) phosphine (TTSP) and ODE and then heated up to 150-300° C., preferred 200-260° C.

The yielding product is the Zn coated InP core suspension wherein InP quantum dots (QD) of mean diameter of 2 to 10 nm are obtained.

In a further step a ZnS shell is deposited on Zn coated InP core. Typically a shell precursor solution comprising either a separate Zn precursor and S-precursor (multiple source) or a single source precursor providing both Zn and S simultaneously is prepared under water and oxygen free atmosphere and is directly injected into the crude core particle suspension at reaction temperature or previously cooled. Typically injection occurs within a second mixing chamber, preferred a magnetic mixing micro-chamber.

Zinc diethyl dithiocarbamate (ZDC) is preferred as a single source precursor for ZnS shell. Shell precursor solution usually further comprises capping ligands for semiconductor nanocrystals, such as oleic acid, oleylamine and trioctyl phosphine (TOP) in the above mentioned inert solvent.

The reaction suspension is allowed to react at reaction temperature until a ZnS shell with a thickness of 0.2 to 4 nm is formed.

The obtained QDs are typically purified by adding an anti-solvent like e.g. methanol, ethanol, isopropanol, butanol or acetone according to procedure known in the state of the art and characterized with e.g. UV-Vis spectroscopy, fluorescence spectroscopy and electronic transmission spectroscopy.

InP QDs with a PL emission color ranging from blue to red could be prepared with the method of the present invention.

Prepared QDs were characterized by the following methods:
quantum yield was measured by comparison with sulforhodamine B according to the method described in "A Guide to Recording Fluorescence Quantum Yields", Jobin Yvon Horiba,
http://www.horiba.com/fileadmin/uploads/Scientific/Documents/Fluorescence/quantumyieldstr ad.pdf, retrieved Oct. 5, 2011.

The photoluminescence of nanoparticles were tested by UV/VIS absorption (Jena Analytics, Specord) and photoluminescence spectroscopy (Fluorolog 3, Jobin Yvon).

The method of the present invention has the following advantages compared to known preparation routes:
1. New active mixing within the microchamber generated by magnetic stirring provided better mixing efficiency than static mixers used in the microreaction systems of the state of the art. Better mixing was shown to lead to higher particle quality.
2. The known use of coordinating molecules zinc carboxylate and hexadecylamine helps to passivate nanocrystalline surfaces, hence increasing the quantum yield. Obtained zinc-rich nanocrystal surface helps further growing of an additional high band-gap ZnS shell on InP cores.

Combined approaches yielded to InP/ZnS QDs with enhanced photoluminescence and photostability.

3. The process of the invention is a simple, fast and scalable continuous-flow method based on capillary microreaction system for the synthesis of high quality InP and InP/ZnS nanocrystals.
4. The present invention is a simple continuous method for the synthesis of highly luminescent InP and core/shell InP/ZnS with high quantum yields. The method allows a fast synthesis of both InP core QDs as well as overcoating of ZnS shells within much less than an hour.

The obtained InP/ZnS QDs had very good stability against photo-bleaching over time and quantum yield of at least 40%. The full width half maximum (FWHM) is between 60 and 150 nm. The as-prepared core/shell InP/ZnS has very less photoluminescence quenching after storing in a nitrogen environment for weeks till months. FIG. 1 illustrates the schematic of core/shell structure of InP/ZnS QDs, and different emission color of InP/ZnS QDs prepared in this report. The color ranges from blue-green till red (500-610 nm).

A further object of the present invention is therefore an InP/ZnS nanoparticle obtainable by the method of the present invention.

Further objects of the present inventions are formulation or device comprising the semiconducting core-shell nanoparticle of the present invention, in particular electronic devices.

EXPERIMENTAL SECTION

Description Figures

FIG. 1. illustrates the schematic of core/shell structure of InP/ZnS QDs, and and photo of QDs samples under UV lamp with different emission color of InP/ZnS QDs as prepared. The color ranges from blue-green till red (500-610 nm).

Figure 2:
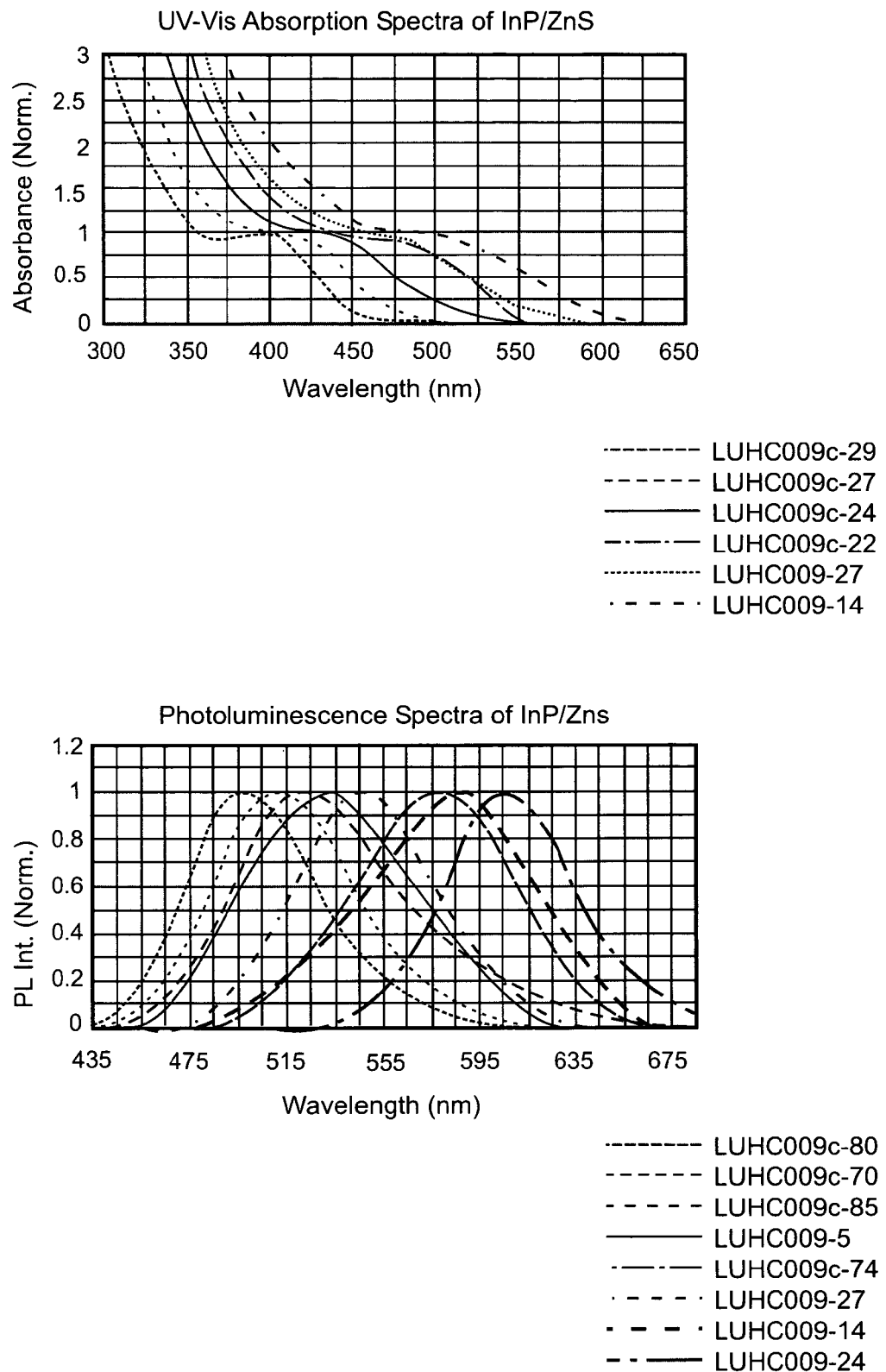

FIG. 2. UV-VIS spectra and Fluorescence spectra of InP/ZnS core/shell QDs.

FIG. 3. scheme of capillary-based microreaction system.

Figure 4A:
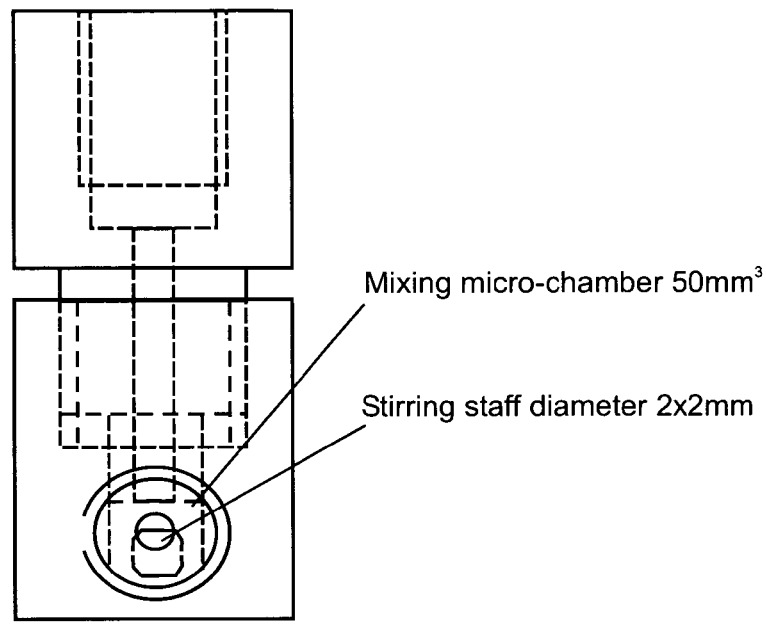
Figure 4A:
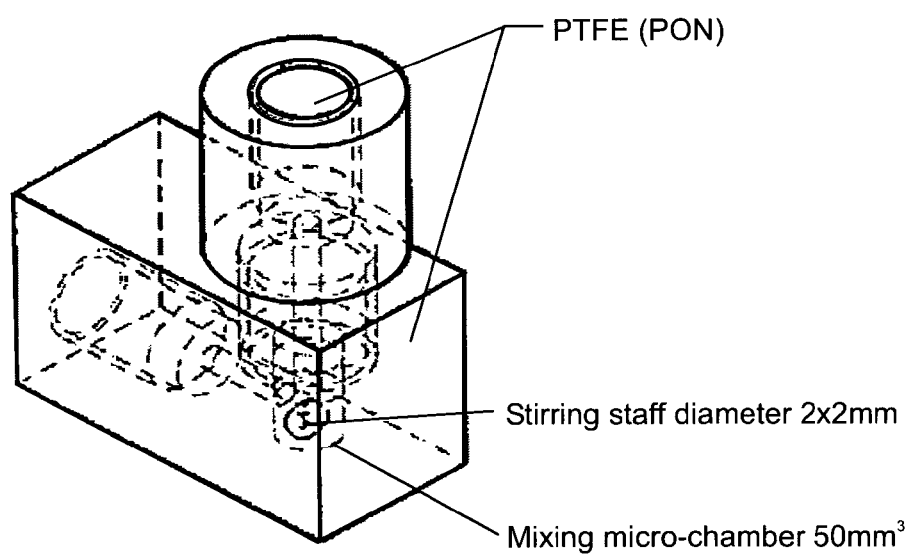
Figure 4B:
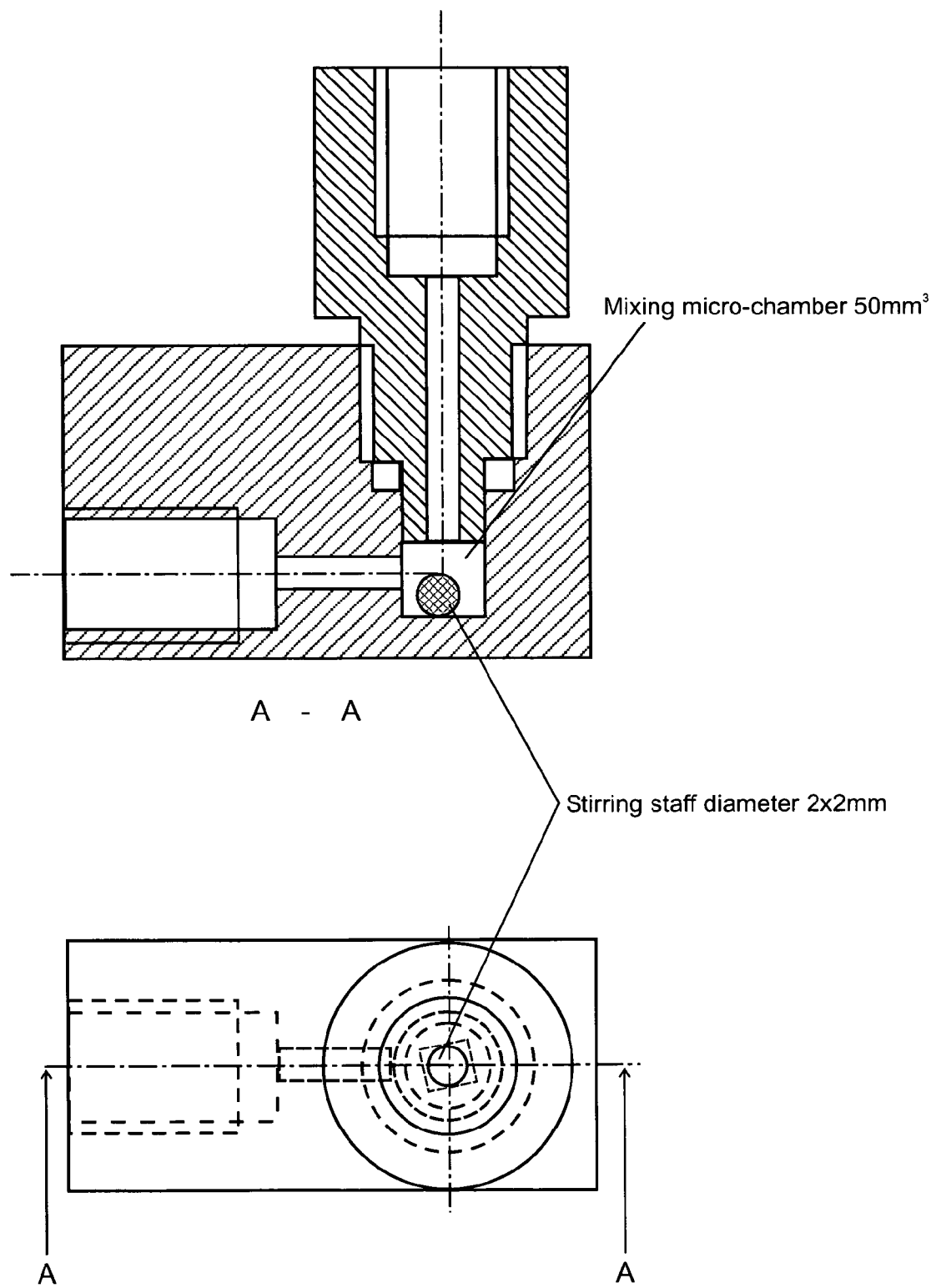

FIGS. 4A and 4B: structure diagram of miniature mixing chamber.

The method of the present invention is exemplified in the following examples without being restricted to the examples below.

Example 1

Batch Synthesis of InP/ZnS Nanocrystalline

Preparation of precursor solution: Phosphine precursor stock solution was prepared in glove-box under nitrogen atmosphere: 0.2 mmol of tris (trimethylsilyl phosphine) (TTSP) and 2 ml of 1-octadecen (ODE) were mixed in glass bottle. Zinc diethyldithiocarbamate (ZDC) stock solution was prepared by dispersing 0.5 g ZDC in 15 mL trioctyl phosphine (TOP) under sonication for a few minutes until a white turbid suspension was obtained.

Preparation of InP QDs Cores:
22 mg (0.1 mmol) indium chloride, 28.2 mg (0.1 mmol) oleic acid, 63.2 mg (0.1 mmol) zinc stearate and 53.5 mg (0.2 mmol) oleylamine (OLA) were mixed with 4 ml ODE in a 50 ml three-necked flask. The flask was repeatedly evacuated and re-filled with nitrogen to provide a water and oxygen-free reaction atmosphere (120° C., for ~30 min). Then, the solution was quickly heated to 230° C. under strong agitation. When the temperature of the solution became stable, 0.5 ml stock TTSP-ODE (0.2 mmol in 2 mL ODE) solution 2) as prepared above was rapidly injected. The solution was kept at 230° C. for some minutes until desired size of InP cores was achieved. Samples were taken after 5, 10, 15 min, etc. (0.5 mL reaction solution of each dissolved in 2 mL toluene, and characterized by UV/Vis spectroscope and Fluorescence spectroscope). The reaction solution was then cooled down to room temperature for the shell overcoating step. Nanocrystals of different size of were also obtained by adjusting the initial concentrations of zinc stearate and HDA.

Overcoating Process for the Preparation of InP/ZnS Core/Shell QDs:
The above InP QDs solution was cooled to room temperature. 1 mL of ZDC in TOP stock solution and 1 mL OLA were added to the reaction mixture. The flask was repeatedly evacuated and flushed with nitrogen to obtain a water and oxygen-free reaction atmosphere. The solution was heated to 150° C. for 20 min. The obtained samples are also characterized by UV/Vis and fluorescence spectroscopy. The photoluminescence of as-prepared InP/ZnS had an increase of 3-10 times in comparison with uncoated InP based on the estimation of intensity and fluorescence spectroscope measurement. The photoluminescence of uncoated InP was quenched after some days storage in normal environment, while the photoluminescence of InP/ZnS were stable for months.

Example 2

Continuous Synthesis of InP Nanocrystallines

Preparation of Precursor Solution
Indium-stock solution was prepared by mixing 220 mg (1 mmol) indium chloride, 282.5 mg (1 mmol) oleic acid and 695.5 mg (2.6 mmol) Oleylamine (OLA) in a 250 ml three-necked flask with 30 ml ODE. The flask was repeatedly evacuated and re-filled with nitrogen to provide a water and oxygen-free reaction atmosphere. The solution was then quickly heated to 120-150° C. under strong agitation until the solid samples were completely dispersed. The precursor solution were then cooled down to room temperature for the later usage. Phosphine-Stock solution was prepared in a glove-box under nitrogen atmosphere: Tris(trimethyl silyl phoshine) and 1-Octadecen (ODE) was mixed in glass bottle. Zinc-carbonate stock solution was prepared by dispersing 0.5 g zinc stearate in 15 mL ODE by sonication for some minutes. The obtained mixture was a white turbid suspension. ZDC-Stock solution (shell precursor solution) was prepared by dispersing 0.5 g ZDC in 15 mL TOP by ultrasonication for some minutes. The obtained mixture was also a white turbid suspension.

Preparation of InP QDs Cores

Stock solutions for core precursor solution (e.g. 3 mL of indium stock solution+1.2 mL of phosphine stock solution+1 mL of zinc stearate stock solution+4.5 mL of ODE) were pumped into the mixer of 50 mm$^3$ volume and then through the capillary system (4 meter of PTFE tube, heated up to 230° C. in oil bath) with a flow rate of 1.0 mL/min. The first sample with color (fluorescence as well) appeared after several min, the InP samples were then collected by glass bottles 1-2 min after gaining the first color suspension. The above InP QDs solution was cooled to room temperature. The continuous system was washed with ODE.

The other sizes of InP (other colors of photoluminescence) were achieved by varying the amount of phosphine and/or zinc stearate solution: increasing the amount of phosphine brought bigger size of InP core, hence red-shifted photoluminescence; decreasing the amount of zinc stearate brought bigger size InP core, hence red-shifted photoluminescence.

Shelling Process for InP/ZnS QDs

For ZnS overcoating, 2.5 mL of InP rude solution and 0.75 mL of ZDC stock solution and 4 mL ODE were pumped to the same continuous system (mixer of 50 mm$^3$ volume and 4 meter of PTFE capillary tube, heated up to 220° C. in oil bath) with a flowrate of 1.0 mL/min. The obtained sample collected and also can be characterized by UV/Vis and fluorescence spectroscopy.

FIG. 2. shows UV-VIS spectra and Fluorescence spectra of InP/ZnS core/shell QDs obtained according to the continuous process of example 2 by varying the amount of phosphine and/or zinc stearate solution.

The invention claimed is:

1. A continuous-flow method for preparing InP/ZnS nanoparticles conducted in a micro-reaction system comprising at least one mixing chamber connected to one reaction chamber, said method comprising:

preparing an indium precursor solution by mixing an indium salt, a fatty protic alkylamine, a fatty alkylacid, and zinc carboxylate with an inert solvent and heating up to 50-200° C. to get a clear solution under water and oxygen free atmosphere;

preparing a phosphine precursor solution comprising tris (trimethylsilyl) phosphine in the inert solvent under water and oxygen free atmosphere;

injecting the indium precursor solution in excess to the phosphine precursor solution into the mixing chamber to obtain a reaction mixture, wherein the mixing chamber is a magnetic mixing micro-chamber with a volume in the range of 10 mm$^3$ to 10,000 mm$^3$, and wherein the injecting is at a flow rate from 0.1 ml/min to 10 ml/min;

forwarding and heating the reaction mixture at a temperature from 160 to 320° C., within the reaction chamber until InP core suspension is obtained;

forwarding the core suspension into a mixing chamber and injecting a shell precursor solution comprising a Zn source and a S source to the core suspension and capping ligands into the mixing chamber;

forwarding and heating the suspension at a temperature from 160 to 320° C. for shell preparation within the reaction chamber; and cooling.

2. The continuous-flow method of claim 1, wherein the Zn source and the S source is a single source.

3. The continuous-flow method of claim 1, wherein the mixing chamber is a magnetic mixing micro-chamber with a volume in the range of 30 mm$^3$ to 70 mm$^3$.

4. The continuous-flow method of claim 1, wherein the reaction chamber has an inner diameter in the range of 0.1 mm and 2 mm and a length in the range of 0.5 m to 20 m.

5. The continuous-flow method of claim 1, wherein the forwarding and heating of the reaction mixture within the reaction chamber until InP core suspension is obtained is at a temperature from 200 to 280° C.

6. The continuous-flow method of claim 1, wherein all operations are completed in less than one hour.

* * * * *